(12) United States Patent
Keehn et al.

(10) Patent No.: US 10,765,033 B1
(45) Date of Patent: Sep. 1, 2020

(54) IMMERSION COOLING ENCLOSURES WITH INSULATING LINERS

(71) Applicant: Microsoft Technology Licensing, LLC, Redmond, WA (US)

(72) Inventors: Nicholas Keehn, Kirkland, WA (US); Eric Clarence Peterson, Woodinville, WA (US); Winston Saunders, Seattle, WA (US); Husam Alissa, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/421,011

(22) Filed: May 23, 2019

(51) Int. Cl.
*H05K 7/20* (2006.01)
*F25B 39/04* (2006.01)

(52) U.S. Cl.
CPC ............ *H05K 7/203* (2013.01); *F25B 39/04* (2013.01); *H05K 7/20236* (2013.01); *H05K 7/20318* (2013.01); *H05K 7/20327* (2013.01); *H05K 7/20827* (2013.01)

(58) Field of Classification Search
CPC ... F25B 39/04; F28D 1/0213; H05K 7/20236; H05K 7/203; H05K 7/20318; H05K 7/20327; H05K 7/20827
See application file for complete search history.

(56) References Cited

U.S. PATENT DOCUMENTS

| | | | | |
|---|---|---|---|---|
| 4,263,499 A * | 4/1981 | Romance | ................. | H05B 3/82 392/448 |
| 2015/0060009 A1* | 3/2015 | Shelnutt | ............. | H05K 7/20809 165/11.1 |
| 2015/0382505 A1* | 12/2015 | Kasahara | ............... | H02H 7/001 361/93.9 |
| 2015/0382515 A1* | 12/2015 | James | ................ | H05K 7/20327 361/679.47 |
| 2016/0014934 A1* | 1/2016 | Shiraiwa | ............ | H05K 7/20318 361/679.53 |
| 2017/0064862 A1* | 3/2017 | Miyoshi | ............ | H01L 21/67109 |
| 2017/0112017 A1* | 4/2017 | Wang | ................. | H05K 7/20236 |
| 2017/0303434 A1* | 10/2017 | Katsumata | .............. | H01L 23/44 |
| 2017/0303442 A1* | 10/2017 | Smith | ................ | H05K 7/20809 |
| 2018/0279507 A1* | 9/2018 | Midgley | ............ | H05K 7/20272 |
| 2018/0338388 A1* | 11/2018 | Wei | ........................... | F28F 1/00 |
| 2019/0200483 A1* | 6/2019 | Tian | ...................... | H05K 7/203 |
| 2019/0357378 A1* | 11/2019 | Kolar | ................. | H05K 7/20318 |
| 2019/0383559 A1* | 12/2019 | Aoki | ..................... | F28D 1/0213 |

* cited by examiner

*Primary Examiner* — Jacob R Crum
(74) *Attorney, Agent, or Firm* — Liang IP, PLLC

(57) ABSTRACT

Immersion cooling enclosures with insulating liners and associated computing facilities are disclosed herein. In one embodiment, an immersion cooling enclosure includes a well formed in a substrate material, a lid in contact with and fastened to the well to enclose an internal space configured to contain a dielectric coolant submerging one or more computing devices in the internal space, and an insulating liner on the internal surfaces of the well. The insulating liner has a first side in contact with the dielectric coolant and a second side in contact with the substrate material of the well. The insulating liner is non-permeable to the dielectric coolant, thereby preventing the dielectric coolant from passing through the insulating liner to the substrate material.

20 Claims, 3 Drawing Sheets

IMMERSION COOLING ENCLOSURES WITH INSULATING LINERS

BACKGROUND

Large computing facilities such as datacenters typically include a distributed computing system housed in large buildings, containers, or other suitable enclosures. The distributed computing system can contain thousands to millions of servers interconnected by routers, switches, bridges, and other network devices. The individual servers can host virtual machines, containers, virtual switches, virtual routers, or other types of virtualized devices. Such virtualized devices can be used to execute applications or perform other functions to facilitate provision of cloud computing services to users.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Servers in datacenters typically include one or more central processing units ("CPUs"), graphic processing units ("GPUs"), solid state drivers ("SSDs"), memory chips, etc. mounted on a printed circuit board to form a "server." CPUs, GPUs, and other components of a server can produce significant amount of heat during operation. If not adequately dissipated, the produced heat can damage and/or degrade performance of the various components on the server.

Various techniques using air cooling have been developed to dissipate heat produced by components of servers. For example, one technique includes placing a fan in a server enclosure (e.g., at a top or bottom of a cabinet) to force cool air from outside of the server enclosure into contact with heat producing components on servers to remove heat to the outside of the server enclosure. In another example, intercoolers (e.g., cooling coils) can be positioned between sections of servers in the server enclosure. The intercoolers can remove heat from groups of the servers in a server enclosure and generally maintain the cooling air at certain temperature ranges inside a server enclosure.

The foregoing air cooling techniques, however, have certain drawbacks. First, air cooling can be thermodynamically inefficient when compared to liquid cooling. Heat transfer coefficients of conduction and/or convection with air and specific heat of air as a heat transfer medium can be an order of magnitude below with water, ethylene glycol, or other suitable types liquid. As such, due to limitation on heat removal, densities of heat producing components (e.g., CPUs and GPUs) on a server motherboard can be limited. In addition, air cooling can have long lag times in response to a control adjustment and/or load change. For example, when a server enclosure has a temperature exceeds a threshold, additional flow of cooling air can be introduced into the server enclosure to reduce the temperature. However, due to slow thermal transfer rates of cooling air, the temperature in the server enclosure may stay above the threshold for quite a long time.

Immersion cooling techniques can address at least some of the foregoing drawbacks of air cooling. Immersion cooling generally refers to a cooling technique according to which components such as CPUs, GPUs, SSDs, memory, and/or other electronics components of a server are submerged in a thermally conductive but dielectric liquid (referred to herein as a "dielectric coolant"). Example dielectrics coolants can include mineral-oils or synthetic chemicals. Such dielectric coolants can have dielectric constants like that of ambient air. For example, a dielectric coolant provided by 3M (Electronic Liquid FC-3284) has a dielectric constant of 1.86 while that of ambient air at 25° C. is about 1.0.

In certain implementations, during operation, the dielectric coolant can remove heat from the heat producing components via boiling of the dielectric coolant by undergoing a phase change of the liquid dielectric coolant into a dielectric vapor, resulting in both liquid and gaseous phases of the dielectric coolant within a server enclosure. The dielectric vapor can then be cooled and condensed back to a liquid form via a circulation system employing liquid pumps, heat exchangers, dry coolers, etc. to reject heat from the dielectric coolant into the surrounding environment. In other implementations, the dielectric coolant can stay in a single-phase during operation. Due to high heat transfer coefficients and specific heat properties of using the dielectric coolant, densities of heat producing components in a server enclosure may be increased. Higher densities of CPUs, GPUs, etc. can result in smaller footprint for datacenters, racks, server enclosures, or other suitable types of computing facilities. High heat transfer coefficients of using the dielectric coolant can also allow fast cool down of sever components in a server enclosure.

One example design of an immersion cooling enclosure includes an elongated container (e.g., a 10-foot long container commonly referred to as a "tank") housing multiple servers mounted vertically in the tank. The tank is typically constructed with welded stainless-steel plates in a rectilinear shape. Such a design for the immersion cooling enclosure, however, can have high engineering, manufacturing, and construction costs. For example, stainless steel plates can be expensive to acquire and costly to process. Welding stainless steel plates together requires special skills and is labor intensive. Also, once welded, the tank typically requires conformance testing, such as using helium, to determine whether any leak exists in the welds or pressure testing. Once tested, the tank is typically installed on a support structure in a facility. As such, deploying immersion cooling enclosures with such as design can have long lead time and can be capital intensive.

Several embodiments of the disclosed technology can address at least some of the drawbacks of the welded stainless-steel design by implementing an insulated-well design for an immersion cooling enclosure. In certain implementations, the immersion cooling enclosure can include a well, pit, hole, or other suitable types of indentation (referred to herein as a "well" for illustration purposes) formed in concrete, earth, bricks, or other suitable types of a substrate material and lined with an insulating liner. In one example, a well can be formed by excavating a portion of the ground (e.g., earth) in a facility to form a rectilinear pit and then pouring concrete to line the excavated portion of the ground to form a concrete well. In other examples, a well can be formed by placing one or more pre-fabricated concrete blocks on the ground in the facility to form a rectilinear well. In further examples, a well can be formed by surrounding a portion of the ground with earth, concrete, or other suitable materials to form an above-ground well. In yet further examples, a well can be formed in other suitable manners.

Without being bound by theory, the inventors have recognized that a dielectric coolant typically have small molecular sizes and thus can generally permeate through concrete and earth. As such, in order to at least reduce or avoid leaking the dielectric coolant from the well through concrete or earth, several embodiments of the disclosed technology are directed to lining the well with the insulating liner that is non-permeable to the dielectric coolant. In one embodiment, the insulating liner can include a single insulating layer of high-density polypropylene (HDPP), high-density polyethylene (HDPE), or other suitable types of non-permeable polymeric material.

In other embodiments, the insulating liner can also include multiple layers arranged in a stack, interweaving, or other suitable manners. For example, the insulating liner can include an insulating layer (e.g., HDPP or HDPE) sandwiched between a protection layer facing the dielectric coolant and a sealing layer opposite the protection layer. The protection layer can include one or more protection materials configured to protect the insulating layer from perforation, scraping, or other suitable types of mechanical damages caused by, for instance, contact with servers during installation or maintenance. Examples of suitable protection materials can include Nylon, Kevlar, ultra-high molecular weight polyethylene, silk, carbon fibers, or combinations of at least some of the foregoing protection materials. The sealing layer can include one or more sealing materials that are configured to automatically seal the insulating layer in case of a perforation is formed in the insulating layer. Examples of suitable sealing materials can include ballistic gelatins, multiple strata of rubber coating, or other suitable sealant that can automatically expand and/or contract to seal a perforation.

In further embodiments, the insulating liner can also include a perfusion layer configured to remove and thus allow detections of any leaked dielectric coolant through the insulating layer. For example, a perfusion layer can include a base having multiple ribs or other suitable types of protrusions extending from the base. Adjacent pairs of the multiple ribs can then form multiple channels in fluid communication with a vacuum source. As such, when the perfusion layer is positioned behind and/or attached to the insulating layer, with or without intermediate layer(s), any leaked dielectric coolant can be removed from behind the insulating layer. By monitoring output from the perfusion layer, leak detection of the dielectric coolant from the well can be achieved using color changing paints, sensors, or other suitable detectors. In other examples, the perfusion layer can also include a top opposite the base such that the multiple ribs extend between the top and the base. In further examples, the perfusion layer can be a built-in layer at the insulating layer, sealing layer, or other suitable layers of the insulating liner.

In certain implementations, the insulating liner can be formed via extrusion and fastened to an internal surface of the well with adhesives, mechanical fasteners, or other suitable fasteners. In other implementations, one or more of the protection, insulating, sealing, or other suitable types of layer may be sprayed on or otherwise formed directly on the internal surface of the well or a preceding layer of the insulating liner. In further implementations, the insulating liner can be formed via vacuum forming, friction welding, sonic welding, or other suitable techniques.

The immersion cooling enclosure can also include a lid, cover, top, or other suitable closure component (referred to herein as "lid" for brevity) that is configured to mate with and seal against the well using one or more O-rings, gaskets, or other suitable sealing devices. The lid can include various components that are configured to facilitate immersion cooling operations in the well. For example, the lid can include a condenser (e.g., a cooling coil) configured to condense a dielectric vapor in a vapor space in the well. The lid can also include suitable conduits, pipes, tubings, etc. to provide a cooling fluid (e.g., cooling water) to the condenser and power/signal to the servers. In other examples, the lid can also include pressure sensors, temperature sensors, sight glasses, or other suitable components configured to facility monitoring, controlling, or other suitable operations of the immersion cooling enclosure.

In further examples, the lid can also include a filter layer that is permeable by air but not the dielectric vapor. An example material suitable for the filter layer includes activated carbon. The filter layer can be position between a vapor space in the well and a vapor outlet to the external environment. As such, air may be withdrawn/introduced from/to the vapor space of the well to control pressure in the well without losing a large amount of dielectric vapor. The withdrawn air can also be further condensed to recover any dielectric coolant still present and return to a collection reservoir and/or the well via, for instance, a circulation pump. In yet further examples, multiple filter layers and/or condensers may be arranged in sequence, interleaved, or other suitable manners between the vapor space and the vapor outlet.

During installation, a rack or other suitable types of supporting device can be placed inside the well. The rack can also include a protection layer at surfaces that contact or come near the well. One or more servers can be placed in the rack. The well is then covered with the lid and sealed. The dielectric coolant is then introduced into the well to fully submerge the servers carried on the rack. During operation, CPUs, GPUs, and other suitable components on the servers can produce heat. The dielectric coolant can absorb the produced heat via boiling by undergoing a phase change to form a dielectric vapor. The dielectric vapor rises in the well to be in contact with the condenser at or attached to the lid. The cooling fluid circulating in the condenser then removes heat from the dielectric vapor and condenses the dielectric vapor into liquid form. The condensed dielectric vapor is then returned to the well via gravity or pump.

Several embodiments of the disclosed immersion cooling enclosure can have lower capital costs and manufacturing complexity than welding stainless steel plates. Unlike in welded tanks, sealing of the immersion cooling enclosure in accordance with the disclosed technology does not rely on welds between stainless steel plates. Instead, sealing is achieved via the insulating liner. Because the insulating liner is not a structural member, engineering and constructing the immersion cooling enclosure can be much simplified than welded stainless steel tanks. As such, costs of engineering, manufacturing, construction, and other suitable types of capital costs can be significantly lowered when compared to using welded stainless-steel tanks as immersion cooling enclosures.

DETAILED DESCRIPTION

Figure 1:
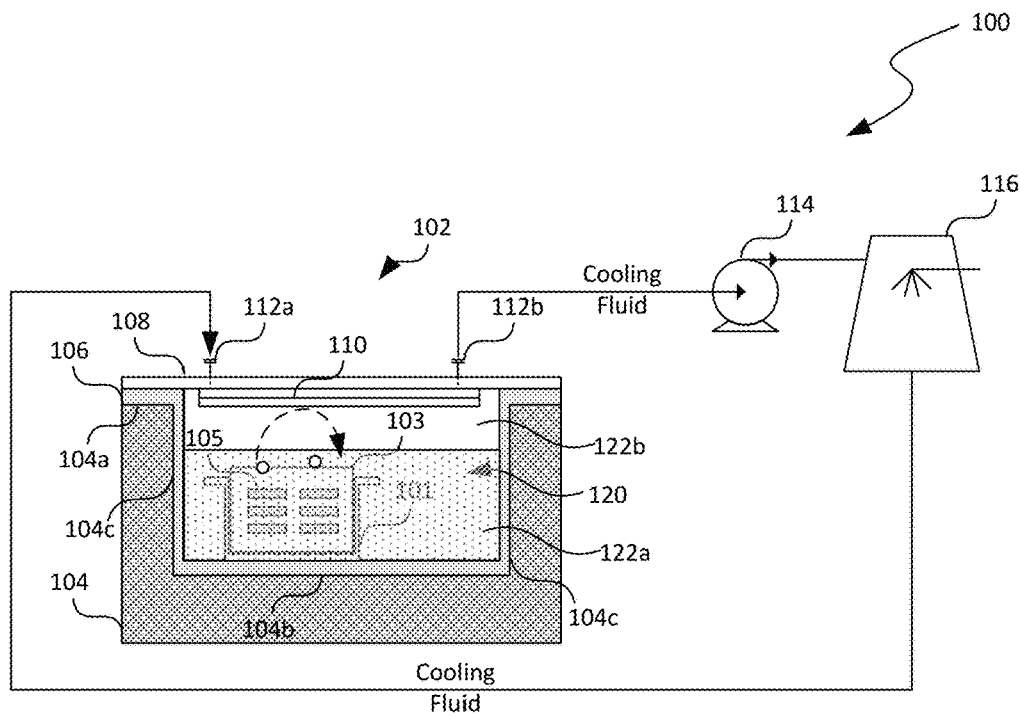
FIG. 1 is a schematic diagram of a computing facility having an immersion cooling enclosure of an insulated-well design that is configured in accordance with embodiments of the disclosed technology.

Certain embodiments of computing facilities, systems, devices, components, modules, and processes for immersion cooling enclosures of an insulated-well design are described below. In the following description, specific details of components are included to provide a thorough understanding of certain embodiments of the disclosed technology. A person skilled in the relevant art can also understand that the disclosed technology may have additional embodiments or may be practiced without several of the details of the embodiments described below with reference to FIGS. 1-4.

As used herein, the term an "immersion server enclosure" generally refers to a housing configured to accommodate a server, server, or other suitable types of computing device submerged in a dielectric coolant inside the housing during operation of the server. A "dielectric coolant" generally refers to a liquid that is thermally conductive but dielectric. Example dielectrics coolants can include mineral-oils or synthetic chemicals. Such a dielectric coolant can have a dielectric constant that is generally like that of ambient air (e.g., within 100%). For example, a dielectric coolant provided by 3M (Electronic Liquid FC-3284) has a dielectric constant of 1.86 while that of ambient air at 25° C. is about 1.0. In certain implementations, a dielectric coolant can have a boiling point low enough to absorb heat through a phase change from operating electronic components (e.g., CPUs, GPUs, etc.). For instance, Electronic Liquid FC-3284 provided by 3M has a boiling point of 50° C. at 1 atmosphere pressure.

Immersion cooling of servers can have many advantages when compared to air cooling. For example, immersion cooling can be more thermodynamically efficient due to higher heat transfer coefficients. However, current designs of immersion cooling enclosures may not be suitable for fast and cost-effective deployment. For example, one design for immersion cooling enclosures includes welding stainless steel plates into an elongated container or "tank." Such a design for the immersion cooling enclosures, however, can have high engineering, manufacturing, and construction costs. For example, stainless steel plates can be expensive to acquire and costly to process. Welding stainless steel plates together requires special skills and is labor intensive. Also, once welded, the tank typically requires conformance testing, such as using helium, to determine whether any leak exists in the welds or pressure testing. Once tested, the tank is typically installed on a support structure t in a facility. As such, deploying immersion cooling enclosures with such as design can have long lead time and can be capital intensive.

Several embodiments of the disclosed technology can address at least some of the drawbacks of the welded stainless-steel design by implementing an insulated-well design for an immersion cooling enclosure. In certain embodiments, the immersion cooling enclosure can include a well formed in concrete, earth, bricks, or other suitable types of a substrate material and lined with an insulating liner. The insulating liner can include an insulating layer that is configured to prevent the dielectric coolant from permeating through the insulating layer and leak from the immersion cooling enclosure. Example materials suitable for the insulating layer can include high-density polypropylene (HDPP), high-density polyethylene (HDPE), or other suitable types of non-permeable polymeric material. Thus, the insulating liner can be used to prevent loss of the dielectric coolant from the immersion cooling enclosure without being a structural member of the well. As such, capital costs for deploying immersion cooling enclosures can be reduced when compared to using welded stainless-steel tanks as immersion cooling enclosures, as described in more detail below with reference to FIGS. 1-4.

FIG. 1 is a schematic diagram of a computing facility 100 having an immersion cooling enclosure 106 of an insulated-well design that is configured in accordance with embodiments of the disclosed technology. As shown in FIG. 1, the computing facility 100 can include an immersion cooling enclosure 102 in which a rack 101 carrying multiple servers or servers (referred to herein as "servers 103" for brevity) are installed. Each of the servers 103 can include one or more heat producing components 105, such as CPUs, GPUs, etc. The computing facility 100 can also include a circulation pump 114 and a cooling tower 116 operatively coupled to the immersion cooling enclosure via an inlet manifold 112a and an outlet manifold 112b. Even though only one immersion cooling enclosure 102 is shown in FIG. 1 for illustration purposes, in other embodiments, the computing facility 100 can include multiple immersion cooling enclosures 102 (not shown) arranged in parallel and coupled to the same inlet and outlet manifolds 112a and 112b, and/or other suitable components.

The circulation pump 114 can be configured to receive a cooling fluid from the immersion cooling enclosure 102 via the outlet manifold 112b and forward the received cooling fluid to the cooling tower 116. The cooling tower 116 can then remove heat from the cooling fluid and provide the cooling fluid to the immersion cooling enclosure 102 via the inlet manifold 112a. The circulation pump 114 can include a centrifugal pump, a piston pump, or other suitable types of pump. Though particular configuration for cooling fluid circulation and cooling is shown in FIG. 1, in other embodiments, the computing facility 100 can also include additional and/or different components. For example, the computing facility 100 can include a chiller, one or more heat exchangers (not shown), and/or other suitable mechanical components.

As shown in FIG. 1, the immersion cooling enclosure 102 can include a well 104 formed in a substrate material (e.g., concrete or earth). The formed well 102 can include an internal surface formed by a first surface 104a at a first elevation, a second surface 104b at a second elevation lower than the first elevation, and side surfaces 104c extending between the first and second surfaces 104a and 104b. In the illustrated example in FIG. 1, the side surfaces 104c extend generally perpendicularly between the first and second surfaces 104a and 104b. In other examples, one or more of the side surfaces 104c can be canted related to the first and/or second surfaces 104a and 104b.

In one implementation, the well 104 can be formed by excavating a portion of the ground (e.g., earth) in the computing facility 100 to form a rectilinear shape and a suitable size and then pouring concrete to line the excavated portion of the ground to form a concrete well 104. In other implementations, the well 104 can be formed by placing one or more pre-fabricated concrete blocks on the ground in the computing facility 100 to form a rectilinear well. In further examples, the well 104 can be formed by surrounding a portion of the ground with earth, concrete, or other suitable materials to form an above-ground well. In yet further examples, the well 104 can be formed in other suitable manners.

An insulating liner 106 can be in contact with and suitably attached to the internal surface of the well 104 via adhesives, mechanical fasteners, or other suitable means. The insulating liner 106 can include at least an insulating layer 126 (shown in FIG. 2A) that is non-permeable to a dielectric coolant 120 and thus prevent or at least reduce a rate of the dielectric coolant 120 leaking through the substrate material of the well 104. Without being bound by theory, the inventors have recognized that the dielectric coolant 120 typically have small molecular sizes and thus can generally permeate through concrete and earth. As such, in order to at least reduce or avoid leaking the dielectric coolant 120 from the well 104 through concrete or earth, several embodiments of the disclosed technology are directed to lining the well 104 with the insulating liner 106 that is non-permeable to the dielectric coolant 120. In one embodiment, the insulating liner 106 can include a single insulating layer 126 of high-density polypropylene (HDPP), high-density polyethylene (HDPE), or other suitable types of non-permeable polymeric material. In other embodiments, the insulating liner 106 can also include multiple layers arranged in a stack, interweaving, or other suitable manners. In further embodiments, one or more of the layers in the insulating liner 106 can also include one or more fluid channels 136 (shown in FIG. 2B) that are configured to trap and/or capture any dielectric coolant 120 escaping from the well 104. Examples of such multi-layered insulating liner 106 are described in more detail below with reference to FIGS. 2A-2C.

The immersion cooling enclosure 102 can also include a lid 108 that is configured to mate with and seal against the well 104 using one or more O-rings, gaskets, or other suitable sealing devices (not shown). For example, as shown in FIG. 1, the lid 108 can include a plate-like structure in contact with and fastened to the first surface 104a of the well 104. As such, the lid 108, the second surface 104b of the well 104, and the side surfaces 104c of the well 104 enclose an internal space configured to contain the dielectric coolant 120. In the illustrated example, the internal space includes a liquid space 122a and a vapor space 122b. In other examples, the internal space can be substantially filled with the dielectric coolant 120 with little or no vapor space 122b.

In certain embodiments, the lid 108 can be constructed from concrete, a metal/metal alloy as a substrate that carries various components that are configured to facilitate immersion cooling operations in the well 104. For example, the lid 108 can include a condenser 110 (e.g., a cooling coil) in thermal communication with the vapor space 122b and configured to condense a vapor of the dielectric coolant 120 in the vapor space 122 in the well 104. In the illustrated embodiment, the condenser 110 is shown as being attached to a side of the lid 108 facing the well 104. In other embodiments, the condenser 110 can also be embedded into the lid 108 or having other suitable configurations. The lid 108 can also include suitable conduits, pipes, tubings, etc. to provide a cooling fluid (e.g., cooling water) to the condenser 110 and power/signal to the servers 103. In other embodiments, the lid 108 can also include pressure sensors, temperature sensors, sight glasses, or other suitable components (not shown) configured to facility monitoring, controlling, or other suitable operations of the immersion cooling enclosure 102.

In operation, heat producing components 105 of the servers 103 in the immersion cooling enclosure 102 can consume power from a power source (not shown, e.g., an electrical grid) to execute suitable instructions to provide desired computing services. The dielectric coolant 120 can absorb the heat produced by the components 105 during operation and eject the absorb heat into the cooling fluid flowing through the condenser 110. In certain embodiments, the dielectric coolant 120 absorbs the heat produced by the servers 103 via a phase transition, i.e., evaporating a portion of the dielectric coolant 120 into a vapor and evaporate into the vapor space 122. The evaporated vapor can then be condensed by the cooling fluid flowing through the condenser 110 via the inlet manifold 112a into a liquid and return to the well 104 via gravity (as illustrated by the dashed arrow) or pump. In other embodiments, the dielectric coolant 110 can absorb the heat without a phase change. The circulation pump 114 then forwards the heated cooling fluid from the outlet manifold 112b to the cooling tower 116 for discarding the heat to a heat sink (e.g., the atmosphere). The cooling fluid is then circulated back to the immersion cooling enclosure 102 via the inlet manifold 112a.

Several embodiments of the immersion cooling enclosure 102 can thus have lower capital costs and manufacturing complexity than welding stainless steel plates. Unlike in welded tanks, sealing of the immersion cooling enclosure 102 in accordance with the disclosed technology does not rely on welds between stainless steel plates. Instead, sealing is achieved via the insulating liner 106. Because the insulating liner 106 is not a structural member, engineering and constructing the immersion cooling enclosure can be much simplified than welded stainless steel tanks. As such, costs of engineering, manufacturing, construction, and other suitable types of capital costs of the immersion cooling enclosure 102 can be significantly lowered when compared to using welded stainless-steel tanks as immersion cooling enclosures.

Figure 2A:
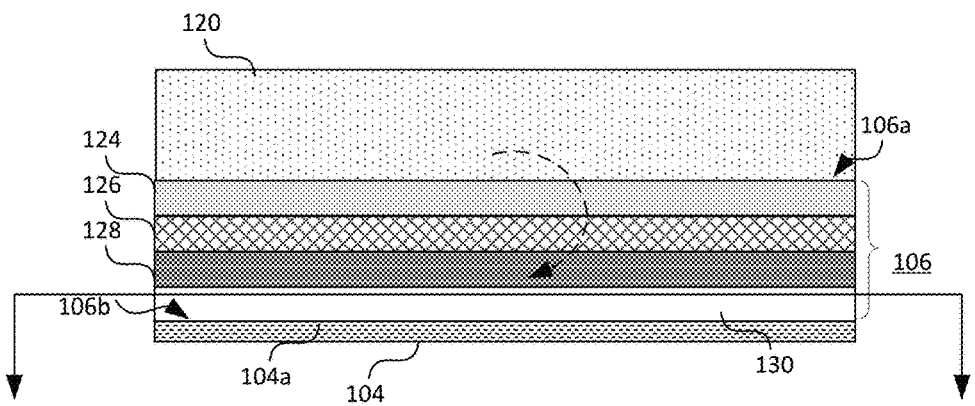
FIGS. 2A-2C are schematic cross-sectional views of an insulating liner suitable for the immersion cooling enclosure in FIG. 1 in accordance with embodiments of the disclosed technology.
Figure 2B:
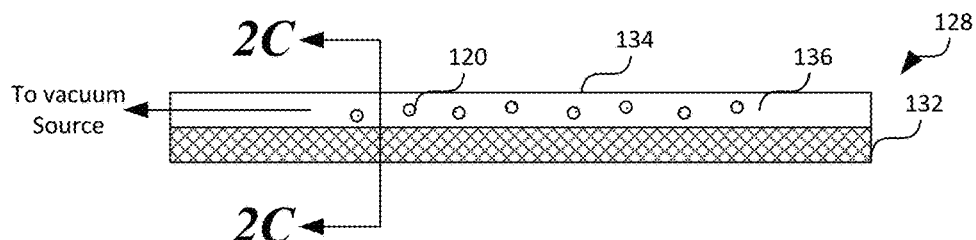
Figure 2C:
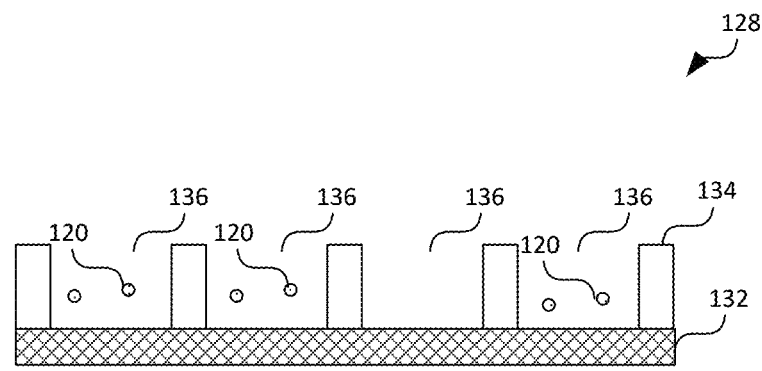

FIGS. 2A-2C are schematic cross-sectional views of an insulating liner 106 suitable for the immersion cooling enclosure 102 in FIG. 1 in accordance with embodiments of the disclosed technology. As shown in FIG. 2A, an example insulating liner 106 can include a protection layer 124 at a first side 106a in contact with the dielectric coolant 120, an insulating layer 126, a sealing layer 128, and a perfusion layer 130 at a second side 106b in contact with substrate material at the internal surface of the well 104 arranged in a stacked formation. In certain embodiments, the various layers shown in FIG. 2A can be formed via extrusion. In other embodiments, the various layers can be sprayed on or otherwise formed directly on the internal surface 104a of the well 104 or a preceding layer of the insulating liner 106. Even though particular layers and arrangements of the layers are illustrated in FIGS. 2A-2C, in some embodiments, one or more of the protection layer 124, sealing layer 128, or perfusion layer 130 may be omitted.

The protection layer can be configured to at least reduce an impact of physical damage, such as punctures scraping, or other suitable types of mechanical damages, to the insulating layer 126. For example, the protection layer 124 can include one or more protection materials configured to protect the insulating layer 126 from perforation, caused by, for instance, contact with servers 103 and/or the rack 101 (FIG. 1) during installation or maintenance. Examples of suitable protection materials can include Nylon, Kevlar, Ultra high molecular weight polyethylene, silk, carbon fibers, or combinations of at least some of the foregoing protection materials.

The sealing layer 128 can include one or more sealing materials that are configured to automatically seal the insulating layer 126 in case of a perforation is formed in the insulating layer 126. Examples of suitable sealing materials can include ballistic gelatins, multiple strata of rubber coating, or other suitable sealant that can automatically expand and/or contract to seal a perforation. Though the sealing layer 128 is shown being between the insulating layer 126 and the perfusion layer 130 in FIG. 2A, in other embodiments, the sealing layer 128 can also be spaced apart from the insulating layer 126 by, for instance, an intermediate layer (not shown). In further embodiments, the sealing layer 128 may have other suitable configurations or being omitted from the insulating liner 106.

The perfusion layer 130 can be configured to remove and thus allow detections of any leaked dielectric coolant 120 through the insulating layer 126 (as illustrated with the dashed arrow). For example, as shown in FIGS. 2B and 2C, the perfusion layer 130 can include a base 132 having multiple ribs or other suitable types of protrusions (referred to herein as "ribs 134" for simplicity) extending from the base. Adjacent pairs of the multiple ribs 134 can then form multiple channels 136 (four are shown in FIG. 2C for illustration purposes) in fluid communication with a vacuum source (not shown). As such, when the perfusion layer 130 is positioned behind and/or attached to the insulating layer 126 (shown in FIG. 2A), with or without intermediate layer(s), any leaked dielectric coolant 120 can be removed from behind the insulating layer 126. By monitoring output from the perfusion layer 130, leak detection of the dielectric coolant 120 from the well 104 can be achieved using color changing paints, sensors, or other suitable detectors. In other examples, the perfusion layer 130 can also include a top (not shown) opposite the base 132 such that the multiple ribs 134 extend between the top and the base 132. In further examples, the perfusion layer 130 can be a built-in layer at the insulating layer 126, sealing layer 128, or other suitable layers of the insulating liner 106.

Figure 3:
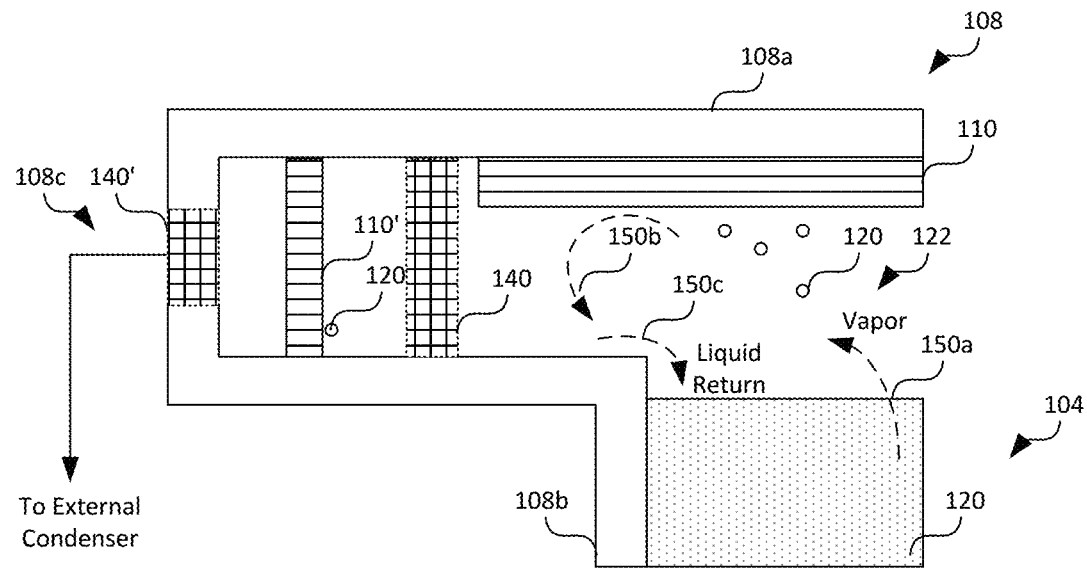
FIG. 3 is schematic cross-sectional view of a lid suitable for the immersion cooling enclosure in FIG. 1 in accordance with additional embodiments of the disclosed technology.

FIG. 3 is schematic cross-sectional view of a lid 108 suitable for the immersion cooling enclosure 102 in FIG. 1 in accordance with additional embodiments of the disclosed technology. As shown in FIG. 3, the lid 108 can include a top portion 108a opposite a bottom portion 108b partially enclosing a portion of the vapor space 122 in the well 104. The lid 108 can also include one or more filter layers 140 extending between the top portion 108a and the bottom portion 108b in the vapor space 122. An example material suitable for the filter layer includes activated carbon. In the illustrated example, the lid 108 includes first and second filter layers 140 and 140' arranged in sequence. The first filter layer 140 is positioned in the vapor space 122 while the second filter layer 140' is positioned at a vapor outlet 108c of the lid 108. A secondary condenser 110' is positioned between the first and second filter layers 140 and 140'. In other examples, the lid 108 can include one, three, four, or any suitable numbers of filter layers 140 with or without intermediate secondary condensers 110'.

As shown in FIG. 3, during operation, the dielectric coolant 120 can at least partially boil and escape into the vapor space 122 of the well 104 as a vapor of the dielectric coolant 120 (as illustrated with the arrow 150a). The vapor then contacts the condenser 110 (as illustrated by the arrow 150b). The cooling fluid (not shown) flowing through the condenser 110 can then remove heat from the vapor and condenses the vapor into a liquid, which then returns to the well 104 via gravity (as illustrated by the arrow 150c) or pump.

During the foregoing operation, air containing the vapor of the dielectric coolant 120 can contact the filter layer 140. The filter layer 140 can then allow air to pass through the filter layer 140 without allowing or at least reducing permeability of the vapor of the dielectric coolant 120 through the filter layer 140. The air with at least a reduced amount of the vapor of the dielectric coolant 120 can then contact the secondary condenser 110', which condenses and returns to the well 104 any remaining dielectric coolant 120 in the air. The air then passes through the secondary condenser 110' and is withdrawn from the vapor space 122 of the well 104 via the second filter layer 140'. As such, air may be withdrawn/introduced from/to the vapor space 122 of the well 104 to control pressure in the well 104 without losing a large amount of the dielectric coolant 120. The withdrawn air can also be further condensed to recover any dielectric coolant 120 still present and return to a collection reservoir (not shown) and/or the well 104 via, for instance, a circulation pump (not shown). In yet further examples, multiple filter layers 140 and/or condensers 110 may be arranged in sequence, interleaved, or other suitable manners between the vapor space 122 and the vapor outlet 108c.

Figure 4:
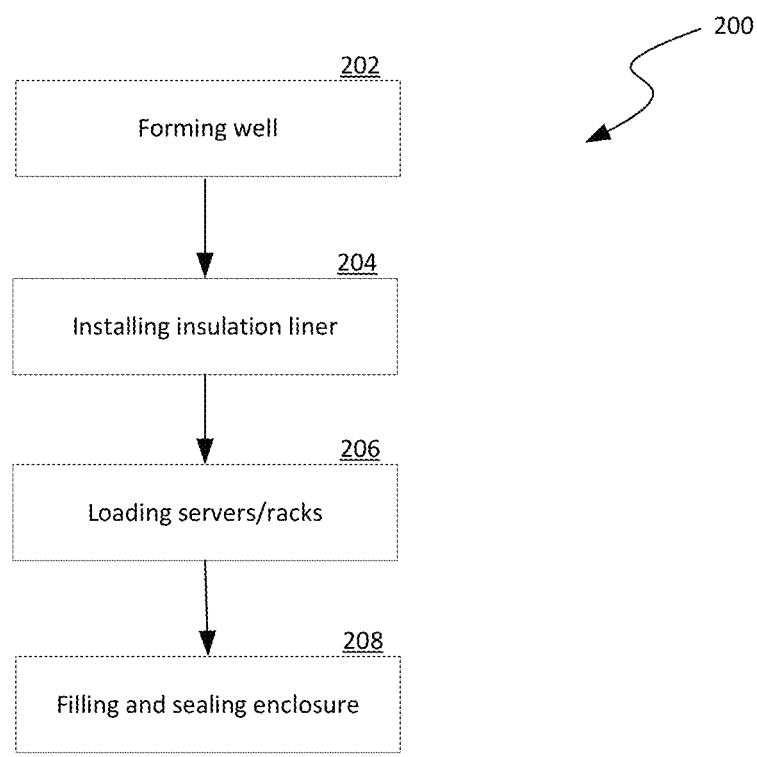
FIG. 4 is a flowchart illustrating an example process of deploying an immersion cooling enclosure of the insulated-well design of FIG. 1 in accordance with embodiments of the disclosed technology.

FIG. 4 is a flowchart illustrating an example process 200 of deploying an immersion cooling enclosure of the insulated-well design of FIG. 1 in accordance with embodiments of the disclosed technology. As shown in FIG. 4, the process 200 can include forming a well at stage 202. Example techniques for forming the well are described above with reference to FIG. 1. The process 200 can then include installing an insulation liner in the formed well at stage 204. As discussed in more detail above with reference to FIGS. 1-2C, the insulation liner can include at least one insulating layer that is configured to prevent a dielectric coolant from leaking through the formed well. The process 200 can then include loading servers and/or racks supporting the servers into the well at stage 206. For example, a rack or other suitable types of supporting device can be placed inside the well and in contact with the insulation liner in the well. The rack can also include a protection layer at surfaces that contact or come in close proximity to the insulation liner. The process 200 can then include covering the well with a lid and sealing the well from outside and filling the well with the dielectric coolant to fully submerge the servers carried on the rack at stage 208.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. An insulated-well immersion cooling enclosure, comprising:
 a well formed in a substrate material, the well having a first surface at a first elevation, a second surface at a second elevation that is lower than the first elevation, and side surfaces extending between the first and second surfaces;
 a lid in contact with and fastened to the first surface of the well, the lid, the second surface of the well, and the side surfaces of the well enclosing an internal space configured to contain a dielectric coolant submerging one or more computing devices in the internal space; and
 an insulating liner on the second surface and the side surfaces of the well, the insulating liner having a first side in contact with the dielectric coolant and a second side in contact with the substrate material at the second surface and the side surfaces of the well, wherein the insulating liner is non-permeable to the dielectric coolant, thereby preventing the dielectric coolant from passing through the insulating liner to the substrate material.

2. The insulated-well immersion cooling enclosure of claim 1 wherein the insulating liner includes an insulating layer constructed from a polymeric material that is non-permeable to the dielectric coolant.

3. The insulated-well immersion cooling enclosure of claim 1 wherein the insulating liner includes:
an insulating layer constructed from a polymeric material that is non-permeable to the dielectric coolant; and
a protection layer between the insulating layer and the dielectric coolant, the protection layer being constructed from one or more of Nylon, Kevlar, ultra-high molecular weight polyethylene, silk, or carbon fibers.

4. The insulated-well immersion cooling enclosure of claim 1 wherein the insulating liner includes:
an insulating layer constructed from a polymeric material that is non-permeable to the dielectric coolant;
a protection layer between the insulating layer and the dielectric coolant, the protection layer being constructed from one or more of Nylon, Kevlar, ultra-high molecular weight polyethylene, silk, or carbon fibers; and
a sealing layer between the insulating layer and the substrate material of the well, the sealing layer being constructed from one or more of a ballistic gelatin or multiple strata of rubber.

5. The insulated-well immersion cooling enclosure of claim 1 wherein the insulating liner includes:
an insulating layer constructed from a polymeric material that is non-permeable to the dielectric coolant; and
a perfusion layer between the insulating layer and the substrate material of the well, the perfusion layer including one or more channels in fluid communication with a vacuum source configured to remove any dielectric coolant passing through the insulating layer.

6. The insulated-well immersion cooling enclosure of claim 1 wherein the insulating liner includes:
an insulating layer constructed from a polymeric material that is non-permeable to the dielectric coolant; and
a perfusion layer between the insulating layer and the substrate material of the well, the perfusion layer including a base having multiple protrusions extending toward the insulating layer, wherein adjacent pairs of protrusions form multiple channels in fluid communication with a vacuum source configured to remove any dielectric coolant passing through the insulating layer.

7. The insulated-well immersion cooling enclosure of claim 1 wherein the lid includes a condenser in thermal communication with the internal space, the condenser being configured to remove heat from a vapor of the dielectric coolant, thereby condensing the vapor of the dielectric coolant into a liquid returned to the internal space via gravity or pump.

8. The insulated-well immersion cooling enclosure of claim 1 wherein the lid includes:
a condenser in thermal communication with the internal space, the condenser being configured to remove heat from a vapor of the dielectric coolant, thereby condensing the vapor of the dielectric coolant into a liquid returned to the internal space via gravity or pump;
a vapor outlet from the internal space of the immersion cooling enclosure; and
a filter layer between the vapor outlet and the condenser, the filter layer being configured to allow air to pass through but not the vapor of the dielectric coolant.

9. The insulated-well immersion cooling enclosure of claim 1 wherein the lid includes:
a vapor outlet from the internal space of the immersion cooling enclosure;
a first condenser;
a second condenser between the first condenser and the vapor outlet, the first and second condensers both being in thermal communication with the internal space and configured to remove heat from a vapor of the dielectric coolant, thereby condensing the vapor of the dielectric coolant into a liquid returned to the internal space of the immersion cooling enclosure via gravity or pump; and
a filter layer between the first and second condensers, the filter layer being configured to allow air to pass through but not the vapor of the dielectric coolant, the filter layer being constructed from carbon.

10. The insulated-well immersion cooling enclosure of claim 1 wherein the lid includes:
a vapor outlet from the internal space of the immersion cooling enclosure;
a first condenser;
a second condenser between the first condenser and the vapor outlet, the first and second condensers both being in thermal communication with the internal space and configured to remove heat from a vapor of the dielectric coolant, thereby condensing the vapor of the dielectric coolant into a liquid returned to the internal space of the immersion cooling enclosure via gravity or pump; and
a first filter layer between the first and second condensers; and
a second filter layer at the vapor outlet, the first and second filter layers being configured to allow air to pass through but not the vapor of the dielectric coolant, the filter layer being constructed from carbon.

11. A computing facility, comprising:
multiple immersion cooling enclosures individually having:
a well formed in a substrate material, the well having a first surface at a first elevation, a second surface at a second elevation that is lower than the first elevation, and side surfaces extending between the first and second surfaces;
a lid in contact with and fastened to the first surface of the well, the lid, the second surface of the well, and the side surfaces of the well enclosing an internal space configured to contain a dielectric coolant, the lid including a condenser in thermal communication with the internal space; and
an insulating liner on the second surface and the side surfaces of the well, the insulating liner having a first side in contact with the dielectric coolant and a second side in contact with the substrate material at the second surface and the side surfaces of the well, wherein the insulating liner is non-permeable to the dielectric coolant, thereby preventing the dielectric coolant from passing through the insulating liner to the substrate material;
one or more servers in the internal space of the individual immersion cooling enclosures, the one or more servers being submerged in the dielectric coolant in the respective immersion cooling enclosures; and
a manifold operatively coupled to the condensers of the multiple immersion cooling enclosures, the manifold being coupled to a source of cooling fluid.

12. The computing facility of claim 11 wherein the insulating liner includes an insulating layer constructed from a polymeric material that is non-permeable to the dielectric coolant.

13. The computing facility of claim 11 wherein the insulating liner includes:
   an insulating layer constructed from a polymeric material that is non-permeable to the dielectric coolant; and
   a protection layer between the insulating layer and the dielectric coolant, the protection layer being constructed from one or more of Nylon, Kevlar, ultra-high molecular weight polyethylene, silk, or carbon fibers.

14. The computing facility of claim 11 wherein the insulating liner includes:
   an insulating layer constructed from a polymeric material that is non-permeable to the dielectric coolant;
   a protection layer between the insulating layer and the dielectric coolant, the protection layer being constructed from one or more of Nylon, Kevlar, ultra-high molecular weight polyethylene, silk, or carbon fibers; and
   a sealing layer between the insulating layer and the substrate material of the well, the sealing layer being constructed from one or more of a ballistic gelatin or multiple strata of rubber.

15. The computing facility of claim 11 wherein the insulating liner includes:
   an insulating layer constructed from a polymeric material that is non-permeable to the dielectric coolant;
   a protection layer between the insulating layer and the dielectric coolant, the protection layer being constructed from one or more of Nylon, Kevlar, ultra-high molecular weight polyethylene, silk, or carbon fibers;
   a sealing layer between the insulating layer and the substrate material of the well, the sealing layer being constructed from one or more of a ballistic gelatin or multiple strata of rubber; and
   a perfusion layer between the insulating layer and the substrate material of the well, the perfusion layer including one or more channels in fluid communication with a vacuum source configured to remove any dielectric coolant passing through the insulating layer.

16. The computing facility of claim 11 wherein the insulating liner includes:
   an insulating layer constructed from a polymeric material that is non-permeable to the dielectric coolant;
   a protection layer between the insulating layer and the dielectric coolant, the protection layer being constructed from one or more of Nylon, Kevlar, ultra-high molecular weight polyethylene, silk, or carbon fibers;
   a sealing layer between the insulating layer and the substrate material of the well, the sealing layer being constructed from one or more of a ballistic gelatin or multiple strata of rubber; and
   a perfusion layer between the insulating layer and the substrate material of the well, the perfusion layer including a base having multiple protrusions extending toward the insulating layer, wherein adjacent pairs of protrusions form multiple channels in fluid communication with a vacuum source configured to remove any dielectric coolant passing through the insulating layer.

17. The computing facility of claim 10 wherein the lids of the immersion cooling enclosures individually include:
   a vapor outlet from the internal space of the immersion cooling enclosure; and
   a filter layer between the vapor outlet and the condenser, the filter layer being configured to allow air to pass through but not the vapor of the dielectric coolant.

18. A method of forming immersion cooling enclosure for housing servers in a computing facility, the method comprising:
   forming a well in a substrate material, the well having a first surface at a first elevation, a second surface at a second elevation that is lower than the first elevation, and side surfaces extending between the first and second surfaces;
   placing an insulating liner on the second surface and the side surfaces of the well, the insulating liner having a first side and a second side opposite the first side and in contact with the substrate material at the second surface and the side surfaces of the well;
   positioning one or more servers in the well, the one or more servers being separated from the substrate material of the well by the insulating liner;
   sealing the one or more servers in the formed well with a lid in contact with the first surface of the well, the lid, the second surface of the well, and the side surfaces of the well enclosing an internal space; and
   filling the internal space formed by the lid, the second surface of the well, and the side surfaces of the well with a dielectric coolant such that the one or more servers are submerged in the dielectric coolant.

19. The method of claim 18 wherein placing the insulating liner includes one or more of:
   fastening the insulating liner to the second surface and the side surfaces of the well via one or more of an adhesive or a mechanical fastener; or
   spraying an insulating material of the insulating liner onto the second surface and the side surfaces of the well.

20. The method of claim 18 wherein placing the insulating liner includes one or more of:
   fastening the insulating liner to the second surface and the side surfaces of the well via one or more of an adhesive or a mechanical fastener, the insulating liner including an insulating layer constructed from a polymeric material that is non-permeable to the dielectric coolant and one or more of:
      a protection layer between the insulating layer and the dielectric coolant, the protection layer being constructed from one or more of Nylon, Kevlar, ultra-high molecular weight polyethylene, silk, or carbon fibers;
      a sealing layer between the insulating layer and the substrate material of the well, the sealing layer being constructed from one or more of a ballistic gelatin or multiple strata of rubber; or
      a perfusion layer between the insulating layer and the substrate material of the well, the perfusion layer including one or more channels in fluid communication with a vacuum source configured to remove any dielectric coolant passing through the insulating layer; or
   spraying a corresponding material of the insulating layer and one or more of the protection layer, the sealing layer, or the perfusion layer onto the second surface and the side surfaces of the well or a preceding layer.

* * * * *